(12) United States Patent
Ahn (10) Patent No.: US 8,748,862 B2
(45) Date of Patent: Jun. 10, 2014

(54) COMPOUND SEMICONDUCTORS

(75) Inventor: Doyeol Ahn, Seoul (KR)

(73) Assignee: University of Seoul Industry Cooperation Foundation, Seoul (KR)

( * ) Notice: Subject to any disclaimer, the term of this patent is extended or adjusted under 35 U.S.C. 154(b) by 0 days.

(21) Appl. No.: 12/498,265

(22) Filed: Jul. 6, 2009

(65) Prior Publication Data

US 2011/0001122 A1    Jan. 6, 2011

(51) Int. Cl.
*H01L 29/06* (2006.01)

(52) U.S. Cl.
USPC .................................. 257/13; 257/E29.094

(58) Field of Classification Search
USPC .................. 257/13, 614, E29.094, E33.005
See application file for complete search history.

(56) References Cited

U.S. PATENT DOCUMENTS

| | | | |
|---|---|---|---|
| 3,920,860 A | 11/1975 | Freller et al. | |
| 3,990,096 A | 11/1976 | Namizaki et al. | |
| 4,764,261 A | 8/1988 | Ondris et al. | |
| 5,079,774 A * | 1/1992 | Mendez et al. | 372/27 |
| 5,112,410 A | 5/1992 | Chen | |
| 5,175,739 A | 12/1992 | Takeuchi et al. | |
| 5,181,219 A | 1/1993 | Mori et al. | |
| 5,181,221 A | 1/1993 | Mori et al. | |
| 5,182,757 A | 1/1993 | Mori et al. | |
| 5,287,377 A | 2/1994 | Fukuzawa et al. | |
| 5,291,506 A * | 3/1994 | Ahn | 372/43.01 |
| 5,291,507 A | 3/1994 | Haase et al. | |
| 5,295,148 A | 3/1994 | Mori et al. | |
| 5,317,584 A | 5/1994 | Mori et al. | |
| 5,349,464 A | 9/1994 | Ishihara et al. | |
| 5,404,027 A | 4/1995 | Haase et al. | |
| 5,404,369 A | 4/1995 | Mori et al. | |
| 5,490,953 A | 2/1996 | Morita | |
| 5,563,902 A | 10/1996 | Xu et al. | |
| 5,576,221 A | 11/1996 | Takemura et al. | |
| 5,606,176 A * | 2/1997 | Nitta | 257/18 |
| 5,646,419 A | 7/1997 | McCaldin et al. | |
| 5,818,072 A * | 10/1998 | Schetzina | 257/78 |
| 5,933,444 A | 8/1999 | Molva et al. | |
| 6,069,380 A | 5/2000 | Chou et al. | |
| 6,501,783 B1 | 12/2002 | Capasso et al. | |
| 6,515,313 B1 | 2/2003 | Ibbetson et al. | |
| 6,627,914 B1 | 9/2003 | Komiyama et al. | |
| 6,713,832 B2 | 3/2004 | Pardo et al. | |
| 6,798,552 B2 | 9/2004 | Tada | |

(Continued)

FOREIGN PATENT DOCUMENTS

| | | |
|---|---|---|
| CN | 101405866 | 4/2009 |
| JP | S61218194 | 9/1986 |

(Continued)

OTHER PUBLICATIONS

Chemistry of Material "Synthesis of CdSeS Nanocrystals in Coordinating and Noncoordinating Solvents: Solvent's Role in Evolution of the Optical and Structural Properties".*

(Continued)

*Primary Examiner* — Vongsavanh Sengdara
(74) *Attorney, Agent, or Firm* — Dorsey & Whitney LLP (57) ABSTRACT

Compound semiconductors capable of emitting light in the green spectrum are provided. The compound semiconductors may display improved quantum efficiencies when applied to various optical devices. Also, light emitting diodes and light emitting diode modules comprising the compound semiconductors are provided.

19 Claims, 5 Drawing Sheets

(56) References Cited

U.S. PATENT DOCUMENTS

| | | |
|---|---|---|
| 6,803,596 B2 | 10/2004 | Hata |
| 6,813,063 B2 | 11/2004 | Ishihara |
| 6,891,329 B2 | 5/2005 | Nagano et al. |
| 6,956,808 B2 | 10/2005 | Miyanishi et al. |
| 7,420,225 B1 | 9/2008 | Wanke et al. |
| 7,638,817 B2 | 12/2009 | Shur et al. |
| 7,656,928 B2 | 2/2010 | Furuyama |
| 8,086,108 B2 | 12/2011 | Tanigawa et al. |
| 8,183,656 B2 | 5/2012 | Okamoto et al. |
| 8,369,370 B2 | 2/2013 | Lell et al. |
| 2002/0031153 A1* | 3/2002 | Niwa et al. ............ 372/45 |
| 2002/0150135 A1* | 10/2002 | Naone et al. ........... 372/45 |
| 2003/0010979 A1 | 1/2003 | Pardo et al. |
| 2004/0058467 A1* | 3/2004 | Chirovsky et al. ...... 438/32 |
| 2004/0095978 A1 | 5/2004 | Cheng et al. |
| 2004/0183087 A1 | 9/2004 | Gardner |
| 2004/0232412 A1* | 11/2004 | Burgener et al. ....... 257/40 |
| 2005/0074576 A1* | 4/2005 | Chaiken et al. ........ 428/64.1 |
| 2005/0185686 A1 | 8/2005 | Rupasov et al. |
| 2005/0285128 A1 | 12/2005 | Scherer et al. |
| 2006/0244003 A1* | 11/2006 | Ueda et al. ........... 257/103 |
| 2007/0063304 A1 | 3/2007 | Matsumoto et al. |
| 2007/0126021 A1 | 6/2007 | Ryu et al. |
| 2007/0126037 A1 | 6/2007 | Ikeda |
| 2007/0194297 A1 | 8/2007 | McCarthy et al. |
| 2007/0298551 A1 | 12/2007 | Bouvet et al. |
| 2008/0048193 A1* | 2/2008 | Yoo et al. .............. 257/89 |
| 2008/0197366 A1 | 8/2008 | Yoo et al. |
| 2009/0017268 A1 | 1/2009 | Skipor et al. |
| 2009/0020149 A1 | 1/2009 | Woods et al. |
| 2009/0114940 A1 | 5/2009 | Yang et al. |
| 2009/0121628 A1 | 5/2009 | Cho et al. |
| 2009/0220017 A1 | 9/2009 | Kawamura |
| 2009/0273820 A1 | 11/2009 | Dionne et al. |
| 2009/0310640 A1 | 12/2009 | Sato et al. |
| 2010/0013040 A1 | 1/2010 | Okamoto et al. |
| 2010/0096001 A1 | 4/2010 | Sivananthan et al. |
| 2010/0155696 A1 | 6/2010 | Duan et al. |
| 2010/0261338 A1 | 10/2010 | Tsakalakos et al. |
| 2010/0276661 A1 | 11/2010 | Ahn |
| 2010/0301308 A1 | 12/2010 | Ahn |
| 2010/0301454 A1 | 12/2010 | Zhang et al. |
| 2010/0326489 A1 | 12/2010 | Ahn |
| 2011/0001121 A1 | 1/2011 | Ahn |
| 2011/0001124 A1 | 1/2011 | Ahn |
| 2011/0001125 A1 | 1/2011 | Ahn |
| 2011/0043884 A1 | 2/2011 | Ahn |
| 2011/0095309 A1 | 4/2011 | Ahn |
| 2011/0114995 A1 | 5/2011 | Ahn |
| 2012/0040483 A1 | 2/2012 | Ahn |
| 2013/0141770 A1 | 6/2013 | Ahn |

FOREIGN PATENT DOCUMENTS

| | | | |
|---|---|---|---|
| JP | H410669 | | 1/1992 |
| JP | H0410669 A | | 1/1992 |
| JP | H0572584 | | 3/1993 |
| JP | H05235488 | | 9/1993 |
| JP | H0613487 | | 1/1994 |
| JP | 07-202340 | | 8/1995 |
| JP | H07231113 | | 8/1995 |
| JP | H07231113 A | | 8/1995 |
| JP | 409199783 A | * | 7/1997 |
| JP | H10215029 | | 8/1998 |
| JP | H10215029 A | | 8/1998 |
| JP | H10303452 | | 11/1998 |
| JP | H10303452 A | | 11/1998 |
| JP | 2001291929 | | 10/2001 |
| JP | 2003092455 | | 3/2003 |
| JP | 2003520438 | | 7/2003 |
| JP | 2004140113 | | 5/2004 |
| JP | 2006210620 | | 8/2006 |
| JP | 2006210620 A | | 8/2006 |
| JP | 2006344673 | | 12/2006 |
| JP | 07-202340 A | | 8/2007 |
| JP | 07202340 | | 8/2007 |
| JP | 2008056511 | | 3/2008 |
| JP | 2008056511 A | | 3/2008 |
| JP | 2008171835 | | 7/2008 |
| JP | 2008171835 A | | 7/2008 |
| JP | 2009032770 | | 2/2009 |
| JP | 2011507289 | | 3/2011 |
| JP | 2012528481 | | 11/2012 |
| WO | WO 2008072688 | | 6/2008 |
| WO | WO 2009067347 | | 5/2009 |
| WO | 2009080012 | | 7/2009 |
| WO | WO 2009/106583 | | 9/2009 |
| WO | WO 2009106583 | | 9/2009 |
| WO | WO 2010137865 | | 12/2010 |
| WO | WO 2011004990 | | 1/2011 |

OTHER PUBLICATIONS

Chemistry of Material "Synthesis of CdSeS Nanocrystals in Coordinating and Noncoordinating Solvents: Solvent's Role in Evolution of the Optical and Structural Properties", Sep. 2007.*

Semiconductor Science and Technology "Green emission and bandgap narrowing due to two-photon excitation in thin film CdS formed by spray pyrolysis", Jun. 2001.*

Seoung-Hwan Park, et al "Crystal-orientation effects on the piezoelectric field and electronic properties of strained wurtzite semiconductors" Physical Review B, vol. 59, No. 7, Feb. 15, 1999-I, pp. 4725-4737.

D. Ahn, et al "A field-effect quantum-well laser with lateral current injection" J. Appl. Phys. 64 (1), Jul. 1, 1988, pp. 440-442.

Seoung-Hwan Park, et al "Many-body optical gain of wurtzite GaN-based quantum-well lasers and comparison with experiment" Appl. Phys. Lett. 72 (3), Jan. 19, 1998, pp. 287-289.

Seoung-Hwan Park, et al "Piezoelectric effects on electrical and optical properties of wurtzite GaN/AlGaN quantum well lasers" Applied Physics Letters vol. 72, No. 24, Jun. 15, 1998, pp. 3103-3105.

Seoung-Hwan Park, et al "Many-body optical gain and intraband relaxation time of wurtzite InGaN/GaN quantum-well lasers and comparison with experiment" Applied Physics Letters 87, 044103 (2005).

Seoung-Hwan Park, et al "Spontaneous and piezoelectric polarization effects in wurtzite ZnO/MgZnO quantum well lasers" Applied Physics Letters 87, 253509 (2005).

Seoung-Hwan Park, et al "Optical gain in InGaN/InGaAlN quantum well structures with zero internal field" Applied Physics Letters 92, 171115 (2008).

I.V. Bradley, et al "Space-charge effects in type-II strained layer superlattices" Journal of Crystal Growth 184/185 (1998), pp. 728-731.

Jie Liu, et al "AlGaN/GaN/InGaN/GaN DH-HEMTs With an InGaN Notch for Enhanced Carrier Confinement" IEEE Electron Device Letters, vol. 27, No. 1, Jan. 2006, pp. 10-12.

Doyeol Ahn "Theory of Non-Markovian Gain in Strained-Layer Quantum-Well Lasers with Many-Body Effects" IEEE Journal of Quantum Electronics, vol. 34, No. 2, Feb. 1998, pp. 344-352.

D. Ahn, et al "Optical Gain and Luminescence of a ZnO-MgZnO Quantum Well" IEEE Photonics Technology Letters, vol. 18, No. 2, Jan. 15, 2006, pp. 349-351.

Doyeol Ahn, et al "Non-Markovian Gain of Strained-Layer Wurtzite GaN Quantum-Well Lasers with Many-Body Effects" IEEE Journal of Selected Topics in Quantum Electronics, vol. 4, No. 3, May/Jun. 1998, pp. 520-526.

Yifei Zhang, et al "Charge control and mobility studies for an AiGan/GaN high electron mobility transistor" Journal of Applied Physics, vol. 85, No. 1, Jan. 1, 1999, pp. 587-594.

Tsung-Hsing Yu, et al "Theoretical study of the two-dimensional electron mobility in strained III-nitride heterostructures" Journal of Applied Physics, vol. 89, No. 7, Apr. 1, 2001, pp. 3827-3834.

Seoung-Hwan Park "Crystal Orientation Effects on Electronic Properties of Wurtzite GaN/AlGaN Quantum Wells with Spontaneous and Piezoelectric Polarization" Jpn. J. Appl. Phys. vol. 39 (2000), pp. 3478-3482.

(56) References Cited

OTHER PUBLICATIONS

P. Waltereit, et al "Nitride semiconductors free of electrostatic fields for efficient white light-emitting diodes" Letters to Nature, vol. 206, Aug. 24, 2000, pp. 865-868.
D. Ahn, et al "Electric field dependence of instrasubband polar-optical-phonon scattering in a quantum well" Physical Review B, vol. 37, No. 5, Feb. 15, 1988-I, pp. 2529-2535.
Doyeol Ahn "Time-convolutionless reduced-desnsity-operator theory of an arbitrary driven system coupled to a stochastic reservoir: Quantum kinetic equations for semiconductors" Physical Review B, vol. 50, No. 12, Sep. 15, 1994-II, pp. 8310-8318.
Doyeol Ahn "Time-convolutionless reduced-desnsity-operator theory of an arbitrary driven system coupled to a stochastic reservoir. II. Optical gain and line-shape function of a driven semiconductor" Physical Review B, vol. 51, No. 4, Jan. 15, 1995-II, pp. 2159-2166.
U.S. Appl. No. 12/472,168, Oct. 1, 2012, Notice of Allowance.
U.S. Appl. No. 12/493,800, Jan. 20, 2012, Office Action.
U.S. Appl. No. 12/493,800, Apr. 26, 2012, Office Action.
U.S. Appl. No. 12/493,800, Oct. 4, 2012, Notice of Allowance.
U.S. Appl. No. 12/498,204, Jul. 4, 2012, Issue Notification.
U.S. Appl. No. 12/498,257, Jul. 3, 2012, Office Action.
U.S. Appl. No. 12/498,257, Nov. 15, 2012, Notice of Allowance.
U.S. Appl. No. 12/545,678, Dec. 16, 2011, Office Action.
U.S. Appl. No. 12/545,678, Jun. 20, 2012, Notice of Allowance.
U.S. Appl. No. 12/545,678, Oct. 2, 2012, Notice of Allowance.
U.S. Appl. No. 12/606,880, Aug. 31, 2012, Notice of Allowance.
U.S. Appl. No. 12/606,880, Oct. 3, 2012, Notice of Allowance.
U.S. Appl. No. 12/472,168, Aug. 18, 2011, Notice of Allowance.
U.S. Appl. No. 12,472,168, Sep. 1, 2011, Notice of Allowance.
U.S. Appl. No. 12/498,228, Dec. 15, 2011, Notice of Allowance.
U.S. Appl. No. 12/498,204, Jul. 28, 2011, Notice of Allowance.
U.S. Appl. No. 12/498,204, Oct. 25, 2011, Notice of Allowance.
U.S. Appl. No. 12/498,257, Nov. 23, 2011, Office Action.
U.S. Appl. No. 12/606,880, Aug. 15, 2011, Notice of Allowance.
U.S. Appl. No. 12/606,880, Nov. 17, 2011, Notice of Allowance.
Alda, Javier et al., "Optical antennas for nano-photonic applications," vol. 16, No. 5, Trends on Nanothecnology. TNT2004. Phantoms Foundations. Segovia (Spain). Sep. 13-17, 2004, http://www.iop.org/EJ/abstract/0957-4484/16/5/017.
Hoang, T. et al., "A high efficiency lateral light emitting device on SOI," Electron Devices for Microwave and Optoelectronic Applications, EDMO 2004, 12th International Symposium, Nov. 8-9, 2004, pp. 87-91.
LEDs Magazine, "Goldeneye sets brightness benchmark for green LEDs", http://www.ledsmagazine.com/news/5/5/18, May 15, 2008, 2 pages.
Smith S.J. et al., "Lateral light emitting n-i-p diodes in InSb/AlxIn1—xSb quantum wells," Applied Physics Letters, vol. 89, p. 111118 (2006), 3 pages.
U.S. Appl. No. 12/606,880, filed Oct. 27, 2009, Ahn.
Arup Neogi, et al. "Enhancement of spontaneous recombination rate in a quantum well by resonant surface plasmon coupling" Physical Review B, vol. 66 (2002) pp. 153305-1-153305-4.
Australian Patent Office; International Search Report and Written Opinion in corresponding PCT application (PCT/KR2010/007292); mailed Jan. 26, 2011.
D-M. Yeh, et al "Surface plasmon coupling effect in an InGaN/GaN single-quantum-well light-emitting diode" Appl. Phys. Lett. 91, 171103 (2007).
E. H. Sargent, et al "Lateral Injection Lasers" International Journal of High Speed Electronics and Systems, Dec. 1998, vol. 9, No. 4, pp. 941-978.
Hetterich J., et al, Optimized Design of Plasmonic MSM Photodetector, IEEE Journal of Quantum Electronics Oct. 2007, vol. 43, No. 10, pp. 855-859.
K. Leosson, et al. "Long-range surface plasmon polariton nanowire waveguides for device applications" Optics Express, vol. 14, No. 1, Jan. 9, 2006 pp. 314-319.

Koichi Okamoto, et al. "Surface-plasmon-enhanced light emitters based on InGaN quantum wells" Nature Materials, vol. 3, Sep. 2004, pp. 601-605.
Liu Liu, et al. "Novel surface plasmon waveguide for high integration" Optics Express, vol. 13, No. 17, Aug. 22, 2005 pp. 6645-6650.
R. Paschotta "Encyclopedia of Laser Physics and Technology, vol. 1", Wiley-VCH, 2008, ISBN 3527408282, 9783527408283 p. 595.
S. Bai, et al. "Determination of the electric field in 4H/3C/4H-SiC quantum wells due to spontaneous polarization in the 4H SiC matrix" Appl. Phys. Lett. 83, 3171 (2003).
Sergey I. Bozhevolnyi, et al. "Channel Plasmon-Polariton Guiding by Subwavelength Metal Grooves" Physical Review Letters, vol. 95, 046802, Jul. 22, 2005, pp. 046802-1-046802-4.
Sumith, B. et al., Quantum Well Infrared Photodetectors for Long Wavelength Infrared Applications Proceedings of SPIE, Oct. 1998, vol. 3436, Infrared Technology and Applications XXIV, pp. 280 to 284.
Taguchi, T., et al., Ultraviolet Laser and Photodetector of CdZnS/ZnS Multiple Quantum Wells, Physica B. 1993, vol. 191, pp. 136-139.
Yu, E.T., et al., Plasmonic Nanoparticle Scattering for Enhanced Performance of Photocoltaic and Photodetector Devices, Proceeding of SPIE, Aug. 28, 2008, vol. 7033, Plasmonics: Nanoimaging, Nanofabrication and their Application IV, pp. 70331V-1-70331V-9.
U.S. Appl. No. 12/472,168, Jun. 18, 2010, Office Action.
U.S. Appl. No. 12/472,168, Jul. 21, 2010, Office Action.
U.S. Appl. No. 12/472,168, Jan. 5, 2011, Office Action.
U.S. Appl. No. 12/472,168, Feb. 22, 2011, Notice of Allowance.
U.S. Appl. No. 12/498,228, Sep. 1, 2010, Office Action.
U.S. Appl. No. 12/498,228, Dec. 23, 2010, Office Action.
U.S. Appl. No. 12/498,204, Apr. 26, 2011, Office Action.
U.S. Appl. No. 12/606,880, Apr. 29, 2011, Office Action.
A. Jia, et al "Design of new UV/blue/green light emitters made of hexagonal-phase ZnMgCdOSSe mixed-crystal system fabricated on GaAs- and InP-(1 1 1) substrates" Journal of Crystal Growth 214/215 (2000) pp. 1085-1090.
J. Ueno, et al "MBE growth of ZnSe/MgCdS and ZnCdS/MgCdS superlatttices for UV-A sensors" Phys. Stat. Sol. (c) 3, No. 4, (2006), pp. 1225-1228.
P.I. Kuznetsov, et al "Hexagonal ZnCdS epilayers and CdSSE/ZnCdS QW structures on CdS(0001) and ZnCdS (0001) substrates grown by MOVPE" Physica E 17 (2003), pp. 516-517.
Chul Huh, et al "Improvement in light-output efficiency of InGaN/GaN multiple-quantum well light-emitting diodes by current blocking layer" Journal of Applied Physics, vol. 92, No. 5, Sep. 1, 2002, pp. 2248-2250.
Seong-Ran Jeon, et al., "GaN tunnel junction as a current aperture in a blue surface-emitting light-emitting diode", Appl. Phys. Lett., vol. 80, No. 11, Mar. 18, 2002, 1933-1935, American Institute of Physics.
P. Walterelt, et al., Nitride semiconductors free of electrostatic fields for efficient white light-emitting diodes, Nature, vol. 406, Aug. 24, 2000, 865-868, Macmillan Magazines Ltd.
Hyunsoo Kim, et al., "Lateral current transport path, a model for GaN-based light-emitting diodes: application to practical device designs", Appl. Phys. Lett., vol. 81, No. 7, Aug. 12, 2002, 1326-1328, American Institute of Physics.
Seong-Ran Jeon, et al., "Lateral current spreading in GaN-based light-emitting diodes utilizing tunnel contact junctions", Appl. Phys. Lett., vol. 78, No. 21, May 21, 2001, 3265-3267, American Institute of Physics.
U.S. Appl. No. 12/498,228, Jul. 12, 2011, Office Action.
U.S. Appl. No. 12/498,204, Jul. 21, 2011, Notice of Allowance.
U.S. Appl. No. 13/485,241, filed May 31, 2012, Ahn.
Siliconfareast.com; "Lattice Constants"; http://www.siliconfareast.com/lattice_constants.htm; 2 pages; retrieved Oct. 7, 2011.
Wikipedia; "Wurtzite crystal structure", http://en.wikipedia.org/wiki/Wurtzite_crystal_structure; 1 page; retrieved Oct. 7, 2011.
"II-VI solar cells moving to the production phase," Photovoltaics Bulletin., (2003), vol. 2003, No. 11, Oct. 2003, pp. 10-12.
Andreani, Lucio Claudio, et al, Exchange interaction and polariton effects in quantum-well excitons, Physical Review B, vol. 41, No. 11, pp. 7536-7544 (1990).

(56) References Cited

OTHER PUBLICATIONS

Angelakis, D. G., et al., "Photon-blockade-induced Mott transitions and XY spin models in coupled cavity arrays," Phys. Rev. A76, 031805 (2007).
Chu, T.L., and Chu, S.S., "Thin film II-VI photovoltaics," vol. 38, Issue 3, Mar. 1995, pp. 533-549.
Compaan, A. D., et al., "Sputtered II-VI Alloys and Structures for Tandem PV," Subcontract Report NREL/SR-520-43954, Sep. 2008, pp. 64.
Gogolin, O., et al., Temperature dependence of exciton peak energies in CuI quantum dots, Solid State Communications, vol. 122, pp. 511-513 (2002).
Goosen, K.W., "Excitonic electroabsorption in extremely shallow quantum wells," Appl. Phys. Lett., vol. 57, Issue 24, pp. 2582-2584, accepted for publication Oct. 1, 1990.
Greentree, A.D., et al., "Quantum phase transitions of light," Nature Physics 2, pp. 856-861 (2006).
Hartmann, M.J., and Plenio, M.B., "Strong Photon Nonlinearities and Photonic Mott Insulators," Physical Review Letters, vol. 99, Issue 10, Sep. 7, 2007, pp. 103601-1-103601-4.
Kawazoe, T., and Masumoto, Y., "Luminescence Hole Burning and Quantum Size Effects of Charged Excitons in CuCl Quantum Dots," Physical Review Letters, vol. 77, Issue 24, pp. 4942-4945 (1996).
Klimov, V.I., et al., "Optical Gain and Stimulated Emission in Nanocrystal Quantum Dots," Science, Oct. 13, 2000, vol. 290, No. 5490, pp. 314-317.
Little, R. B., et al., "Formation of quantum-dot quantum-well heteronanostructures with large lattice mismatch: ZnS/CdS/ZnS" Journal of Chemical Physics, vol. 114, No. 4, 2001, pp. 1813-1822.
Masumoto, Y., et al., "Observation of persistent spectral hole burning in CuBr quantum dots," Physical Review B, vol. 52, No. 7, pp. 4688-4691 (1995).
Obloh, H., "Group III-nitride based blue emitters," Advances in Solid State Physics, vol. 38, 15-28 (1999).
Park, S.-H., et al., "Internal field engineering in CdZnO/MgZnO quantum well structures," Applied Physics Letters, vol. 94, Issue:8, pp. 083507, 1-3 (2009).
Ricker, T., "Samsung's "world's smallest" 8.4 megapixel CMOS sensor: so long CCD?," accessed at http://www.engadget.com/2007/03/27/samsungs-worlds-smallest-8-4-megapixel-cmos-sensor-so-long/, Mar. 27, 2007, pp. 4.
Tassone, F., et al, "Quantum-well reflectivity and exciton-polariton dispersion," Physical Review B, vol. 45, No. 11, pp. 6023-6030 (1992).
Valenta, J., et al., "Hole-filling of persistent spectral holes in the excitonic absorption band of CuBr quantum dots," Applied Physics Letters, vol. 70, No. 6, pp. 680-682 (1997).
Williams, R.S., et al., "Growth and luminescence spectroscopy of a CuCl quantum well structure," Journal of Vacuum Science and Technology A: Vaccum, Surfaces and Films, vol. 6, No. 3, pp. 1950-1952 (1988).
Hernández, F. E. et al., "High Performance Optical Limiter," accessed at http://web.archive.org/web/20050429144449/http://www.ieee.org/organizations/pubs/newsletters/leos/dec00/high.htm, accessed on May 7, 2012, pp. 5.
Shakya, J., et al., "Switching characteristics of III-Nitride blue/green micro-LEDs," The Smithsonian/NASA Astrophysics Data System, American Physical Society, Annual March Meeting, Mar. 12-16, 2001.
S. X. Jin, et al., "Size dependence of III-nitride microdisk light-emitting diode characteristics," Applied Physics Letters, May 28, 2001, vol. 78, No. 22, pp. 3532-3534.
International Search Report and Written Opinion for International Application No. PCT/KR2010/002649 mailed on Jul. 26, 2010.
International Search Report and Written Opinion for International Application No. PCT/KR2010/005600 mailed on Oct. 22, 2010.
International Search Report and Written Opinion for International Application No. PCT/KR2010/008118 mailed on Feb. 11, 2011.
U.S. Appl. No. 12/472,168, Mar. 29, 2012, Notice of Allowance.
U.S. Appl. No. 12/472,168, May 29, 2012, Notice of Allowance.
U.S. Appl. No. 12/498,204, Mar. 26, 2012, Notice of Allowance.
U.S. Appl. No. 12/498,204, May 29, 2012, Notice of Allowance.
U.S. Appl. No. 12/606,880, Feb. 16, 2012, Notice of Allowance.
U.S. Appl. No. 12/606,880, May 23, 2012, Notice of Allowance.
U.S. Appl. No. 12,498,204, Feb. 1, 2012, Office Action.
Internation Search Report and Written Opinion, mailed Sep. 10, 2010, as issued in connection with Patent Application No. PCT/KR2010/004350, filed Jul. 5, 2010.
U.S. Appl. No. 12/472,168, Jan. 23, 2013, Issue Notification.
U.S. Appl. No. 12/493,800, Jan. 16, 2013, Issue Notification.
U.S. Appl. No. 12/498,257, Feb. 20, 2013, Issue Notification.
U.S. Appl. No. 12/545,678, Jan. 16, 2013, Issue Notification.
U.S. Appl. No. 12/606,880, Jan. 16, 2013, Issue Notification.
U.S. Appl. No. 13/279,945, Jan. 25, 2013, Notice of Allowance.
U.S. Appl. No. 13/279,945, May 6, 2013, Notice of Allowance.
U.S. Appl. No. 13/758,115, May 15, 2013, Notice of Allowance.
Nishida, N., et al. "Heteroepitaxy of CuCl on GaAs and Si substrates," Surface Science, vol. 324, Issue 2-3, pp. 149-158 (1995).
Yanase, A. and Segawa, Y., "Stranski-Krastanov growth of CuCl on MgO(001)," Surface Science, vol. 367, Issue 1, pp. L1-L7 (1996).
Takata, M., et al., "MBE growth condition of CuCl thin filims and their optical properties," CAMP 14th, pp. 27-30 (2003).
U.S. Appl. No. 12/498,228, Sep. 16, 2013, Notice of Allowance.
U.S. Appl. No. 13/279,945, Aug. 14, 2013, Issue Notification.
U.S. Appl. No. 13/758,115, Sep. 5, 2013, Notice of Allowance.
U.S. Appl. No. 13/485,241, Oct. 28, 2013, Notice of Allowance.
Wikipedia, "Zinc Selenide," accessed at http://web.archive.org/web/20090504023429/http://en.wikipedia.org/wiki/Zinc_selenide, last modified on Apr. 12, 2009, 2 pages.
Fujikata, J., et al., "Waveguide-Integrated Si Nano-Photodiode with Surface-Plasmon Antenna and its Application to On-chip Optical Clock Distribution," Applied Physics Express , vol. 1 , pp. 176-178 (2008).
International Search Report and Written Opinion, mailed Aug. 10, 2010, as issued in connection with Patent Application No. PCT/KR2011/003322, filed on May 26, 2010.
U.S. Appl. No. 13/758,115, Dec. 24, 2013, Notice of Allowance.
U.S. Appl. No. 12/498,228, Mar. 28, 2014, Notice of Allowance.
U.S. Appl. No. 13/758,115, Mar. 5, 2014, Issue Notification.
U.S. Appl. No. 13/485,241, Apr. 7, 2014, Notice of Allowance.

* cited by examiner

COMPOUND SEMICONDUCTORS

CROSS REFERENCE TO RELATED APPLICATION

This application is related to U.S. patent application Ser. No. 12/472,168 filed May 26, 2009, to U.S. patent application Ser. No. 12/498,257 filed Jul. 6, 2009, to U.S. patent application Ser. No. 12/498,204 filed Jul. 6, 2009, to U.S. patent application Ser. No. 12/498,228 filed Jul. 6, 2009, and to U.S. patent application Ser. No. 12/606,880 filed Oct. 27, 2009.

TECHNICAL FIELD

The described technology relates to compound semiconductors.

BACKGROUND

A light-emitting diode (hereinafter, referred to as an LED) is an electronic light source, based on a semiconductor diode. When an LED is forward biased (switched on), electrons are able to recombine with holes, and energy is released in the form of light. This effect is called electroluminescence and the color of the light is determined by the energy gap of materials in the semiconductor.

LEDs provide many advantages over traditional light sources including lower energy consumption, longer lifetime, improved robustness, smaller size and faster switching.

Applications of LEDs are diverse. For instance, they may be used as a low-energy replacement for traditional light sources in well-established applications such as lighting, indicators and automotive lighting. The compact size of LEDs has allowed new text, video displays and sensors to be developed, while their high switching rates are useful in communication technology.

LEDs may also be used to produce high intensity white light. There are two ways of producing white light using LEDs. One way is to use individual LEDs that emit three primary colors—red, green and blue, and then mix all the colors to produce white light. The other way is to use phosphors to convert monochromatic light from LEDs to broad-spectrum white light.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

This document discloses compound semiconductors (hereinafter, referred to as "II-VI semiconductors") that include at least one element selected from the elements in group II of the periodic table and at least one element selected from the elements in group VI of the periodic table. The compound semiconductors disclosed herein can emit light in the green spectrum.

The term "II-VI compound semiconductor" as used herein refers to a compound semiconductor including at least one element from group II of the periodic table, and at least one element from group VI of the periodic table. As long as the II-VI compound semiconductor includes the above elements, it may further include at least one element selected from a group other than group II or group VI of the periodic table. Also, the II-VI semiconductor may have a binary, ternary, quaternary or other structure.

The term "light in the green spectrum" (hereinafter, referred to as "green light") as used herein refers to light having a wavelength ranging from about 499 nm to about 568 nm. Green light may also mean light having a wavelength ranging from about 520 nm to about 560 nm or light having a wavelength of about 520 nm.

The term "elements in group II of the periodic table" (hereinafter, referred to as "group II elements") as used herein may also mean elements belonging to group 2 and group 12 of the periodic table. The group II elements include beryllium (Be), magnesium (Mg), calcium (Ca), strontium (Sr), barium (Ba), radium (Ra), zinc (Zn), cadmium (Cd), mercury (Hg) or ununbium (Uub).

The term "elements in group VI of the periodic table" (hereinafter, referred to as "group VI elements") as used herein may also mean elements belonging to group 16 of the periodic table. The group VI elements include oxygen (O), sulfur (S), selenium (Se), tellurium (Te) or polonium (Po).

In one embodiment, the II-VI semiconductor may include at least one of magnesium (Mg), zinc (Zn) or cadmium (Cd) from the group II elements, and at least one of sulfur (S) or selenium (Se) from the group VI elements.

In another embodiment, the II-VI semiconductor may include at least one of zinc (Zn) or cadmium (Cd) from the group II elements, and at least one of sulfur (S) or selenium (Se) from the group VI elements.

In still another embodiment, the II-VI semiconductor may include cadmium (Cd) from the group II elements, and at least one of sulfur (S) or selenium (Se) from the group VI elements.

In yet another embodiment, the II-VI semiconductor may include CdS, CdSeS, MgSeS, ZnSeS, MgCdSeS, ZnCdSeS, MgZnSeS, CdZnO, ZnO or MgCdZnO In a further embodiment, the II-VI semiconductor may be represented by formula 1 below:

$$CdSe_xS_{1-x} \qquad \text{[formula 1]}$$

wherein x is 0 to 0.4.

In the above formula 1, x may be in the range of about 0.06 to about 0.36 or about 0.12 to about 0.36. In one embodiment, x may be about 0.06, about 0.12 or about 0.15.

The above compound of formula 1 may be an alloy of CdS and CdSe. Both of these compounds are direct band gap semiconductors and have a strong excitation binding energy, and thereby, when the compound of formula 1 is applied to various optical devices, the quantum efficiency thereof can be improved.

In one embodiment, the II-VI semiconductor may have a low-symmetry structure to efficiently suppress the propagation of defects when it is applied to various optical devices. The types of the low-symmetry structure are not particularly limited, and examples thereof include a hexagonal structure (wurtzite structure). In the hexagonal structure, the lattice constant in the a-axis may be in the range of about 2.5 Å to about 5.5 Å, about 3 Å to about 4.7 Å or about 4 Å to about 4.7 Å. In one embodiment, the lattice constant in the a-axis may be about 4.13 Å, about 4.2 Å, about 4.3 Å or about 4.7 Å.

The methods for preparing the II-VI semiconductor are not particularly limited, and any of a variety of conventional techniques for the formation of compound semiconductors may be applied. For example, a physical vapor deposition (PVD) method such as thermal evaporation, DC sputtering, RF sputtering, ion beam sputtering, pulsed laser deposition, metalorganic vapor phase epitaxy (MOVPE), hybrid vapor phase epitaxy (HVPE), liquid phase epitaxy (LPE), metalorganic molecular beam epitaxy (MOMBE), atomic layer deposition (ALD) or molecular beam epitaxy (MBE) or a chemical vapor deposition (CVD) method such as thermal CVD, low pressure CVD, plasma enhanced CVD, metal-organic CVD or combinations thereof may be used.

This document also discloses light emitting diodes comprising a substrate; a light generating layer that is formed on the substrate and includes a quantum well layer having the above II-VI semiconductor; and at least two ion-doping regions formed at both sides of the light generating layer, so that carriers can be laterally injected from the ion-doping regions to the light generating layer.

Figure 1:
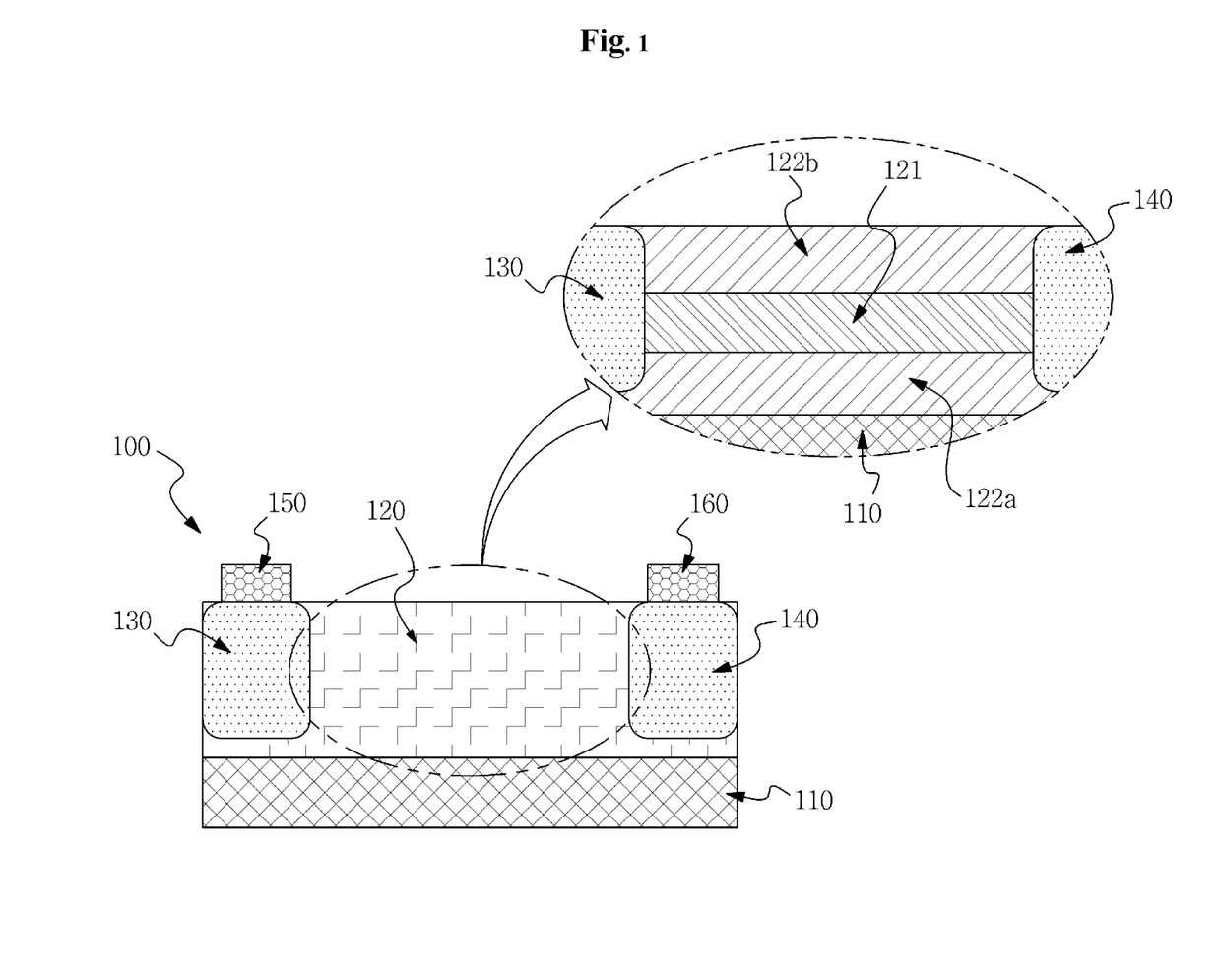
FIG. 1 shows a schematic of an illustrative embodiment of a light emitting diode comprising a compound semiconductor.

FIG. 1 shows a schematic of an illustrative embodiment of a light emitting diode (LED) 100. Referring to FIG. 1, the light emitting diode 100 includes a substrate 110 and a light generating layer 120 that is formed on the substrate 110. Further, as depicted in FIG. 1, the light generating layer 120 includes a quantum well layer 121, barrier layers 122a and 122b, and two ion-doping regions 130 and 140 formed at both sides (i.e., ends) of the light generating layer 120.

The quantum well layer 121 includes the II-VI semiconductor. The quantum well layer 121 may have a thickness ranging from about 20 nm to about 200 nm, about 50 nm to about 200 nm, from about 70 nm to about 150 or from about 90 nm to about 120 nm.

The barrier layer 122a or 122b is formed on one or both sides of the quantum well layer 121. In one embodiment, as shown in FIG. 1, the barrier layers 122a and 122b may be formed on both sides of the quantum well layer 121. In other embodiments, either the barrier layer 122a or 122b may not be present. For example, the barrier layer 122a may not be formed below the quantum well layer 121.

The barrier layers 122a and/or 122b may also include at least one element selected from the group II elements and at least one element selected from the group VI elements. In some embodiments, the barrier layer 122a and/or 122b may include at least one of magnesium (Mg), zinc (Zn) or cadmium (Cd) from the group II elements, and at least one of sulfur (S) or selenium (Se) from the group VI elements. In another embodiment, the barrier layer 122a and/or 122b may include ZnS, MgZnS, MgCdZnS, ZnO, MgZnO, BeO, BeZnO or MgBeZnO.

In some embodiments of the light emitting diode 100, the barrier layer 122a and/or 122b may have a thickness ranging from about 30 nm to about 200 nm, from about 70 nm to about 150 or from about 90 nm to about 120 nm.

In one embodiment, the barrier layer 122a and/or 122b may be lattice-matched with the quantum well layer 121. In another embodiment, the difference between the lattice constant of the quantum well layer 121 and the barrier layer 122a and/or 122b may be not more than about 2.0%, not more than about 1.0%, not more than about 0.5% or not more than 0.3%. According to one embodiment of the light emitting diode 100, the composition of the barrier layer 122a and/or 122b may be selected such that the internal field effects in the light generating layer 120, which may be generated by the spontaneous and piezoelectric polarization, can be reduced. As a result, the quantum efficiency of the light generating layer 120 can be improved.

In still another embodiment, the barrier layer 122a and/or 122b may include a compound represented by formula 2 below:

[formula 2]

wherein y is 0 to 1, and z is 0 to 1

In the above formula 2, y may be in the range of about 0 to about 0.7, about 0 to about 0.5 or about 0 to about 0.3. Further, in the above formula 2, z may be in the range of about 0 to about 0.7, about 0 to about 0.5 or about 0 to about 0.3.

As shown in FIG. 1, at least two ion-doping regions 130 and 140 may be formed at both lateral sides of the light generating layer 120 to inject charge carriers laterally therein, when forward biased. One of the ion-doping regions 130 or 140 may be an $N^+$ ion-doping region and the other may be a $P^+$ ion-doping region. Also, the $N^+$ and $P^+$ ion-doping regions may be formed respectively on the opposite lateral sides of the light generating layer 120.

In one embodiment, the ion-doping regions 130 and/or 140 may have a depth ranging from about 2,000 Å to about 6,000 Å, from about 3,000 Å to about 5,000 Å or from about 3,500 Å to about 4,500 Å. In another embodiment, the ion-doping regions 130 and 140 may have a depth of about 4,000 Å. Also, the distance between the ion-doping regions 130 and 140 may be about 50 microns to about 100 microns.

Referring again to the light emitting diode 100 shown in FIG. 1, electrodes 150 and 160 may be formed on the ion-doping regions 130 and 140, respectively, for applying an electric field thereto. When an electric field is applied to the ion-doping regions 130 and 140 through the electrodes 150 and 160, carriers can be laterally injected from the ion-doping regions 130 and 140 to the light generating layer 120. In this document, the term "carrier" may mean an electron or a hole, which is recombined in the light generating layer 120 to produce light corresponding to the band gap energy of materials of the compound semiconductor. As discussed above, since the carriers are injected to the light generating layer laterally, the carriers do not need to pass through several hetero junction layers, and therefore non-radiative recombination processes do not occur. As a result, the carrier injection rate and intrinsic quantum efficiency can be improved.

The above light generating layer 120 may be formed on any conventional substrate 110. Examples of the materials suitable for use as the substrates 110 are not particularly limited, but may include sapphire, spinnel, SiC, Si, ZnO, ZnSe or GaAs. When GaAs is used as the substrate 110, GaAs-(111) or GaAs-(001) may be used. Also, when Si is used as the substrate 110, Si-(111) may be used.

Figure 2:
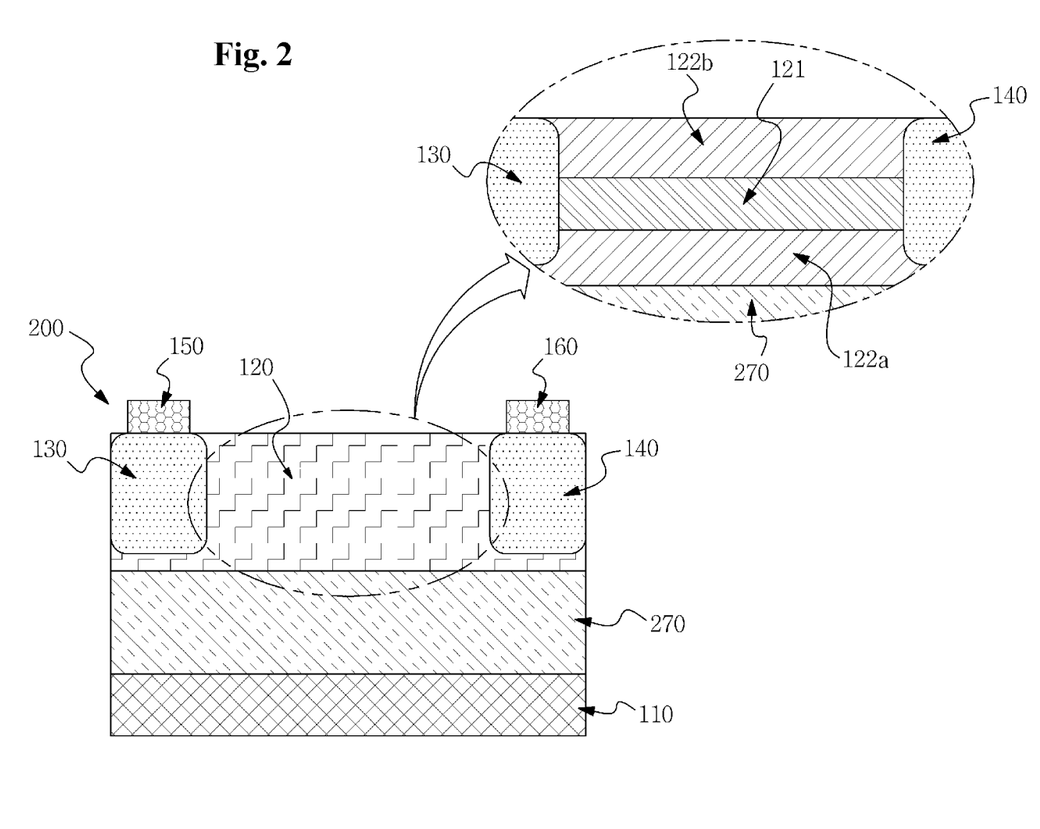
FIG. 2 shows a schematic of another illustrative embodiment of a light emitting diode comprising a compound semiconductor.

FIG. 2 shows a schematic of an illustrative embodiment of a light emitting diode (LED) 200. As depicted, in addition to the components described above in conjunction with the light emitting diode 100, the light emitting diode 200 may further include a buffer layer 270 formed between the light generating layer 120 and the substrate 110. Except for the buffer layer 270, since the other parts of the light emitting diode 200 are the same as the corresponding parts of the light emitting diode 100 shown in FIG. 1, detailed descriptions of the substantially similar parts (i.e., the light generating layer, the ion-doping regions, the electrodes and the substrate) will not be provided.

The buffer layer 270 may also include at least one element selected from the group II elements and at least one element selected from the group VI elements. In one embodiment, the buffer layer 270 may include ZnS.

Methods for constructing the aforementioned light emitting diodes are not particularly limited, and any conventional method such as the above-described deposition techniques can be applied. For example, in one embodiment, a conventional substrate may be provided with an appropriate thickness, and then a light generating layer including the barrier layer and the quantum well layer may be grown upon the substrate using a conventional deposition technique. After the light generating layer has been grown, the ion-doping regions and the electrode may be formed using any one of a variety of conventional methods such as ion implantation techniques, deposition techniques or the like. In another embodiment, before the light generating layer is grown, the buffer layer may be formed on the substrate to prevent cracking, warpage or dislocation in the diode.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations or expanded into additional steps and operations without detracting from the essence of the disclosed embodiments.

This document also discloses a light emitting diode module including a circuit board, a light emitting diode as described above (hereinafter, referred to as a "green LED") mounted on the circuit board, and a light emitting portion that can emit light in the blue or red spectrum and be mounted on the circuit board.

The light emitting diode module (hereinafter, referred to as "LED module") includes the LED as described above as a green light source. In one embodiment, the LED module may be configured such that two or more different colored lights may be mixed with green light emitted from the LED so as to produce white light.

In the LED module, the light emitting portion configured to emit light in the blue spectrum may emit light having a wavelength ranging from about 450 nm to about 500 nm. In one embodiment, the light emitting portion configured to emit light in the blue spectrum may include a light emitting diode (hereinafter, referred to as "blue LED"). The blue LED usable herein is not particularly limited, and any conventional one such as an LED composed of zinc selenide (ZnSe) or indium gallium nitride (InGaN) may be used.

In the LED module, the light emitting portion configured to emit light in the red spectrum may emit light having a wavelength ranging from about 610 nm to about 760 nm. In one embodiment, the light emitting portion configured to emit light in the red spectrum may include a light emitting diode (hereinafter, referred to as "red LED") or a phosphor (hereinafter, referred to as "red phosphor"). The red LED usable herein is not particularly limited, and any conventional LED such as an LED composed of aluminum gallium arsenide (AlGaAs), gallium arsenide phosphide (GaAsP), aluminum gallium indium phosphide (AlGaInP) or Gallium (III) phosphide (GaP) may be used. Also, the red phosphor usable herein is also not particularly limited, as long as it is capable of absorbing light emitted from the green LED or blue LED in the LED module, and emitting light in the red spectrum.

Examples of the phosphor may include nitride red phosphor or yttrium-aluminum-garnet (YAG) red phosphor.

In one embodiment, each of the green, red or blue LEDs may be directly mounted on the circuit board or, alternatively, may be mounted in a reflector cup of at least one package body.

According to another embodiment, the LED may be encapsulated by a conventional sealant such as epoxy resin, urea resin, silicone resin or glass, and the sealant may include the phosphor and/or a dispersant. The dispersants usable herein are not particularly limited, and may include barium titanate, titanium oxide, aluminum oxide or silicon dioxide.

According to one embodiment of the LED module, the light emitting portion configured to emit light in the red spectrum may be the red phosphor. In this case, the green and blue LEDs may be mounted on the circuit board, and a sealant including the red phosphor may encapsulate both of the blue and green LEDs or only the blue LED.

According to another embodiment, the LED module may include at least one package body with a reflector cup disposed on the circuit board, and the green or blue LED may be mounted in the reflector cup. In this case, the green and blue LEDs may be mounted together in the same reflector cup, and a sealant comprising the red phosphor can encapsulate both of the blue and green LEDs. Alternatively, each of the blue and green LEDs may be mounted separately in different reflector cups.

FIGS. 3 to 7 show schematics of various illustrative embodiments of the LED module.

Figure 3:
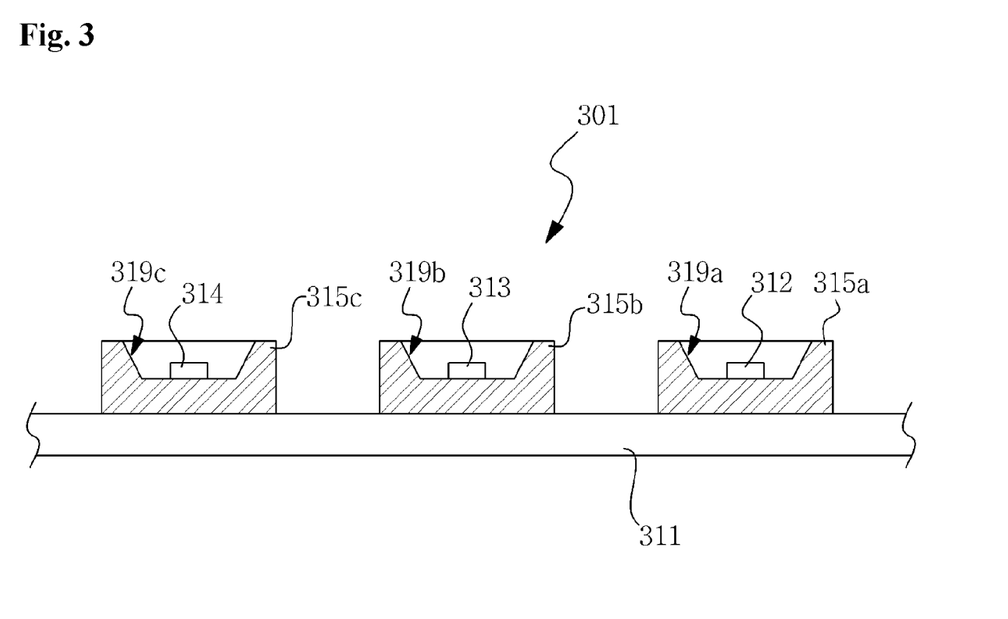
FIGS. 3 to 7 show schematics of various illustrative embodiments of a light emitting diode module comprising a light emitting diode.

In one embodiment, as shown in FIG. 3, an LED module 301 may include a blue LED 312, a green LED 313 and a red LED 314, which are arranged on a circuit board 311. The circuit board 311 may be any conventional circuit board, such as a printed circuit board (PCB). The LEDs 312, 313 and 314 may be any one of the above described LEDs. As depicted in FIG. 3, the blue LED 312, green LED 313 and red LED 314 may be provided in reflector cups 319*a*, 319*b* and 319*c* of respective package bodies 315*a*, 315*b* and 315*c*, which are mounted on the circuit board 311.

Figure 4:
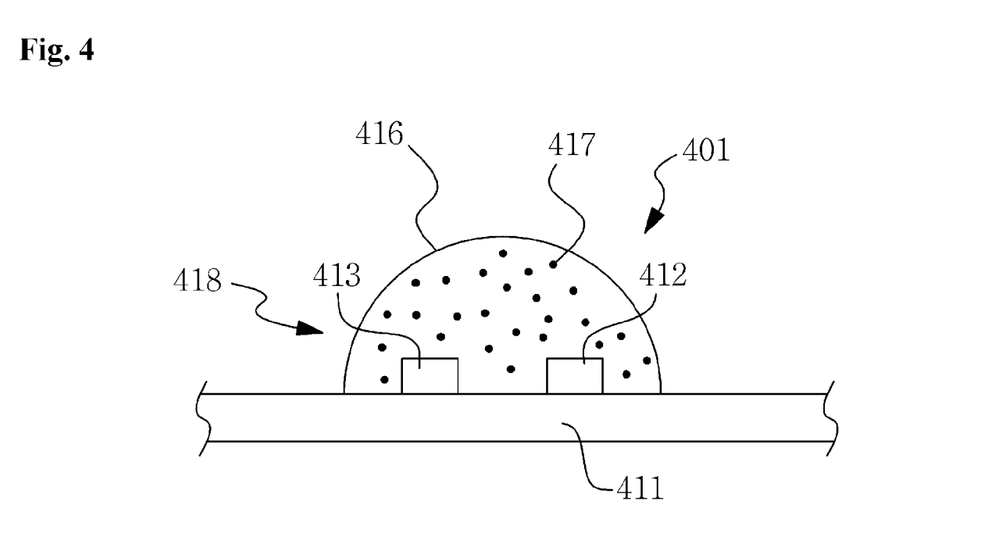

In another embodiment, as shown in FIG. 4, an LED module 401 may include a blue LED 412 and a green LED 413 mounted on a circuit board 411 such as a PCB. The LEDs 412 and 413 are encapsulated in a sealant 416 including red phosphors 417. In this embodiment, the LEDs 412 and 413 may be directly mounted on the circuit board 411. The sealant 416 not only protects the LEDs 412 and 413 as well as their connection parts, but may also function as a lens. In this case, in operation, the blue LED 412 and the green LED 413 may emit blue and green light, respectively, and the red phosphor 417 may be excited mainly by the light emitted from the blue LED 412 to produce red light. Also, a light generating unit 418 may be repeatedly arranged on the circuit board 411 to form a desired surface light source or line light source.

Figure 5:
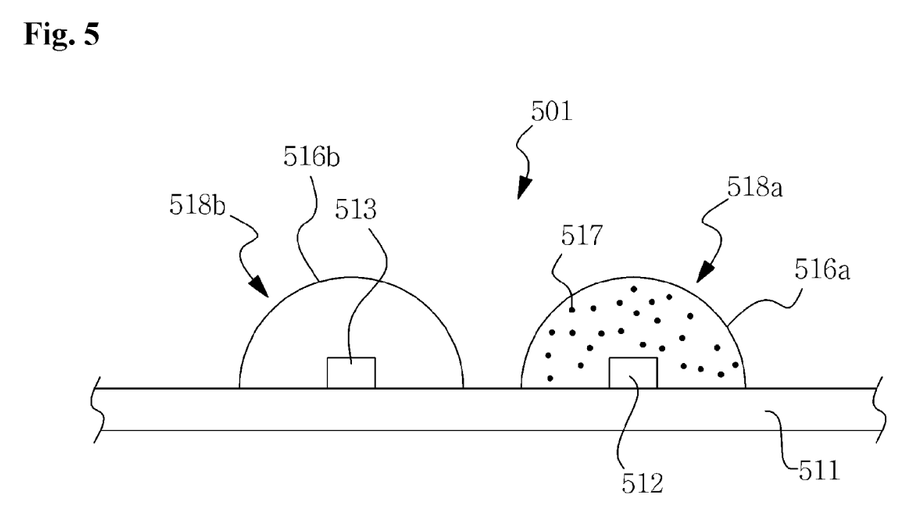

In another embodiment, as shown in FIG. 5, unlike the LED module 401 described in FIG. 4, separate sealants 516*a* and 516*b* may encapsulate a blue LED 512 and a green LED 513, respectively. As depicted in FIG. 5, an LED module 501 may include a first light source unit 518*a* including the blue LED 512, the sealant 516*a* and a red phosphor 517. The sealant 516*a* may encapsulate the blue LED 512 and include the red phosphor 517. Also, as depicted in FIG. 5, the LED module 501 may include a second light source unit 518*b* including the green LED 513 and the transparent sealant 516*b* that does not include the phosphor but encapsulates the green LED 513. The LED module 501 may have a similar configuration as the LED module 401 in FIG. 4, except that the sealants 516*a* and 516*b* separately encapsulate the LEDs 512 and 513, respectively. In this case, the red phosphor 517 may be excited by light emitted from the blue LED 512 so as to emit red light. Therefore, white light may be produced by mixing blue and green light emitted from the blue and green LEDs 512 and 513, and red light emitted from the red phosphor 517. In this embodiment, the first light source unit 518a including the blue LED 512 and the red phosphor 517, and the second light source unit 518b including the green LED 513 may be repeatedly arranged on a circuit board 511 to form a desired surface light source or line light source.

Figure 6:
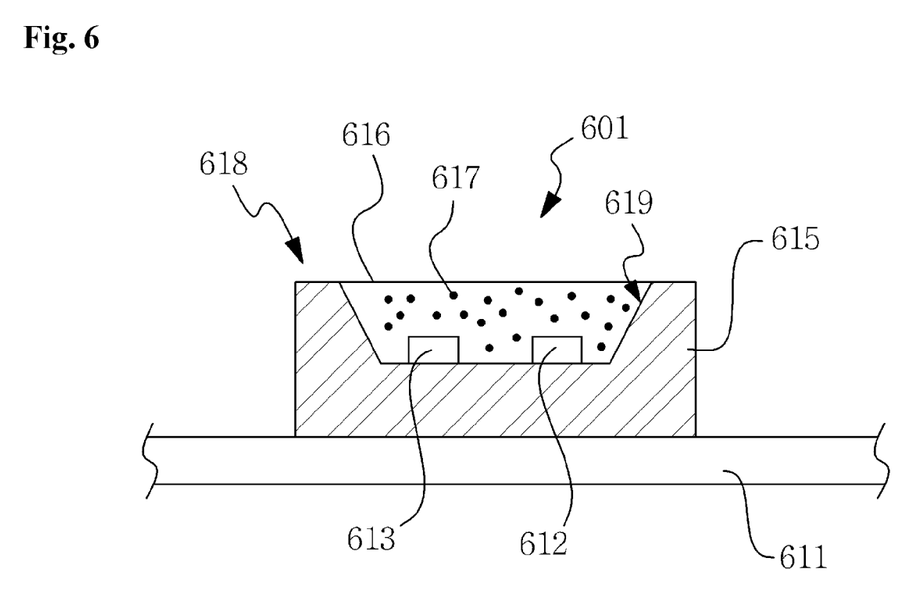

FIG. 6 shows a schematic of another illustrative embodiment of the LED module. As shown in FIG. 6, an LED module 601 may include a blue LED 612 and a green LED 613 mounted in the same package body 615 that has a recessed reflector cup 619. In this embodiment, the blue LED 612 and the green LED 613 may be mounted together in the same reflector cup 619, and a sealant 616 including the red phosphor 617 may encapsulate both the blue and green LEDs 612 and 613. Also, an LED package 618 including the blue and green LEDs 612 and 613 and the phosphor 617 may be repeated on a circuit board 611 in order to obtain a desired surface light source or line light source.

Figure 7:
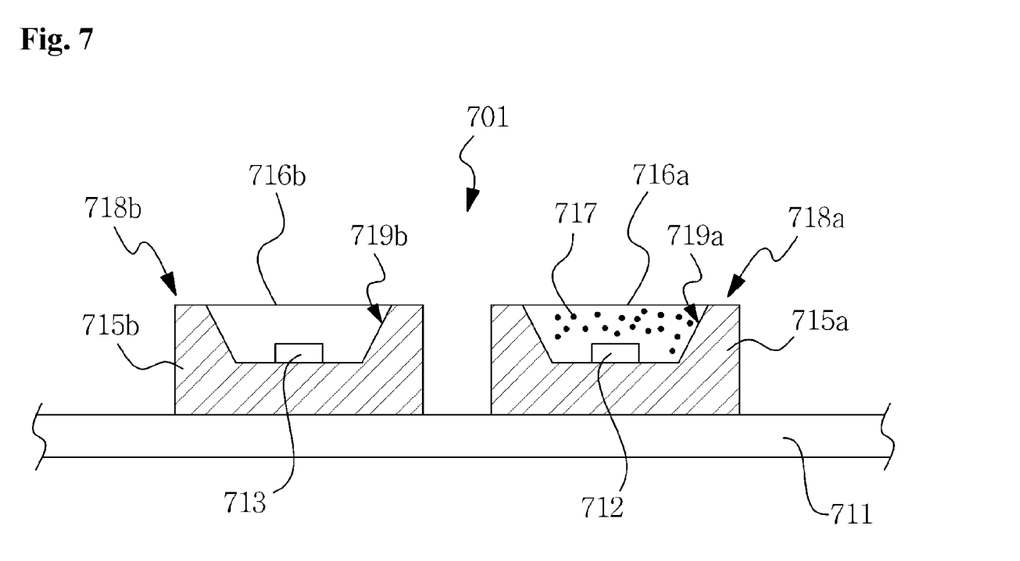

FIG. 7 shows still another embodiment of the LED module. As shown in FIG. 7, similar to the LED module 501 shown in FIG. 5, an LED module 701 may include separate light source units including LEDs mounted in package bodies. In this case, a blue LED 712 may be mounted in a reflector cup 719a of one package body 715a, and a green LED 713 may be mounted in a reflector cup 719b of another package body 715b. Also, a sealant 716a containing a red phosphor 717 may encapsulate only the blue LED 712, and a transparent resin encapsulate 716b which does not contain phosphors may encapsulate the green LED 713. Also, in this embodiment, LED package units 718a and 718b including the blue LED 712 and the green LED 713, respectively, may be repeated on a circuit board 711 in order to create a desired surface light source or line light source.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member of subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third, and upper third, etc. As will also be understood by one skilled in the art all language such as "up to," "at least," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells.

Similarly, a group having 1-5 cells refers to groups having 1, 2, 3, 4, or 5 cells, and so forth.

From the foregoing, it will be appreciated that various embodiments of the present disclosure have been described herein for purpose of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A light emitting diode comprising:
   a substrate having a top surface;
   a light generating layer that is formed on the top surface of the substrate, the light generating layer including a quantum well layer having a compound semiconductor comprising at least one element selected from group II elements and at least one element selected from group VI elements, the compound semiconductor being capable of emitting light in green spectrum, the light generating layer further including a barrier layer formed on at least one side of the quantum well layer, wherein the barrier layer has a composition and lattice constant effective to reduce an internal field formed across the quantum well region by electrical polarization and piezoelectric fields, wherein the light generating layer is capable of emitting light substantially perpendicular to the quantum well through the barrier layer so that the light that is emitted substantially perpendicular to the quantum well is the primary output of the light emitting diode;
   a first ion-doping region formed laterally adjacent a first side of the light generating layer; and
   a second ion-doping region formed laterally adjacent a second side of the light generating layer;
   a first electrode formed on the first ion-doping region; and
   a second electrode formed on the second ion-doping region;
   wherein the quantum well layer directly contacts the first and second ion-doping regions so that carriers can be laterally injected from the first and second ion-doping regions to the light generating layer.

2. The light emitting diode according to claim 1, wherein the compound semiconductor has one of binary, ternary or quaternary structures.

3. The light emitting diode according to claim 1, wherein the light in green spectrum has a wavelength ranging from about 499 nm to about 568 nm.

4. The light emitting diode according to claim 1, wherein the group II elements are magnesium, zinc or cadmium and the group VI elements are sulfur or selenium.

5. The light emitting diode according to claim 1, wherein the compound semiconductor is represented by $$CdSe_xS_{1-x},$$

wherein x is 0 to 0.4.

6. The light emitting diode according to claim 1, wherein the compound semiconductor has a hexagonal structure.

7. The light emitting diode according to claim 6, wherein the lattice constant of the hexagonal structure in a-axis is in the range of about 2.5 Å to about 5.5 Å.

8. The light emitting diode according to claim 1, wherein the barrier layer comprises at least one of ZnS, MgZnS, MgCdZnS, ZnO, MgZnO, BeO, BeZnO or MgBeZnO.

9. The light emitting diode according to claim 1, wherein the barrier layer is lattice-matched with the quantum well layer.

10. The light emitting diode according to claim 9, wherein the difference between the lattice constant of the quantum well layer and the barrier layer is not more than about 2.0%.

11. The light emitting diode according to claim 8, wherein the barrier layer comprises a compound represented by $$Mg_yCd_zZn_{(1-z-y)}S$$

wherein y is 0 to 1, z is 0 to 1.

12. The light emitting diode according to claim 1, wherein the one of the ion-doping regions is an $N^+$ doping region and another of the ion-doping regions is a $P^+$ doping region.

13. The light emitting diode according to claim 1, wherein the substrate is fabricated from sapphire, spinnel, SiC, Si, ZnO, ZnSe or GaAs.

14. The light emitting diode according to claim 1, further comprising a buffer layer formed between the substrate and the light generating layer.

15. The light emitting diode according to claim 14, wherein the buffer layer comprises ZnS.

16. A light emitting diode module comprising:
    a circuit board;
    a light emitting diode mounted on the circuit board comprising:
      a substrate having a top surface;
      a light generating layer that is formed on the top surface of the substrate, the light generating layer including a quantum well layer having a compound semiconductor comprising at least one element selected from group II elements and at least one element selected from group VI elements, the compound semiconductor being capable of emitting light in green spectrum, the light generating layer further including a barrier layer formed on at least one side of the quantum well layer, wherein the barrier layer has a composition and lattice constant effective to reduce an internal field formed across the quantum well region by electrical polarization and piezoelectric fields, wherein the light generating layer is capable of emitting light substantially perpendicular to the quantum well through the barrier layer as the primary light output of the light emitting diode module;
      a first ion-doping region formed laterally adjacent a first side of the light generating layer;
      a second ion-doping region formed laterally adjacent a second side of the light generating layer;
    a first electrode formed on the first ion-doping region; and
    a second electrode formed on the second ion-doping region;
      wherein the quantum well layer directly contacts the first and second ion-doping regions so that carriers can be laterally injected from the first and second ion-doping regions to the light generating layer; and
    a light emitting portion configured to emit light in blue or red spectrums and be mounted on the circuit board.

17. The light emitting diode module according to claim 16, wherein the light emitting portion is a light emitting diode or a phosphor.

18. A light emitting diode comprising:
    a substrate having a top surface;
    a light generating layer formed on the top surface of the substrate, the light generating layer having a bottom side adjacent the top surface of the substrate, a top side that is opposite the bottom side through which light is emitted, a first lateral side extending from the bottom side of the light generating layer to the top side of the light generating layer, and a second lateral side that is opposite the first lateral side extending from the bottom side of the light generating layer to the top side of the light generating layer, the light generating layer including a quantum well layer having a compound semiconductor comprising at least one element selected from group II elements and at least one element selected from group VI elements, the compound semiconductor being capable of emitting light in green spectrum, the light generating layer further including a barrier layer formed on at least one side of the quantum well layer, wherein the barrier layer has a composition and lattice constant effective to reduce an internal field formed across the quantum well region by electrical polarization and piezoelectric fields, wherein the light generating layer is capable of emitting light substantially perpendicular to the quantum well through the top side as the primary light output of the light emitting diode;

a first ion-doping region formed along the first lateral side of the light generating layer such that the fist ion-doping region extends from the bottom side of the light generating layer to the top side of the light generating layer where light is emitted; and a second ion-doping region formed along the second lateral side of the light generating layer such that the second ion-doping region extends from the bottom side of the light generating layer to the top side of the light generating layer where light is emitted, wherein the quantum well layer directly contacts the first and second ion-doping regions.

19. The light emitting diode according to claim 1, wherein the first ion-doping region is on a right side of the light generating layer and the second ion-doping region is on a left side of the light generating layer.

\* \* \* \* \*

UNITED STATES PATENT AND TRADEMARK OFFICE
CERTIFICATE OF CORRECTION

PATENT NO. : 8,748,862 B2
APPLICATION NO. : 12/498265
DATED : June 10, 2014
INVENTOR(S) : Ahn It is certified that error appears in the above-identified patent and that said Letters Patent is hereby corrected as shown below:

ON THE TITLE PAGE:

On Page 2, in Item (56), under "FOREIGN PATENT DOCUMENTS", in Column 1, Line 1, delete "JP H410669 1/1992".

On Page 2, in Item (56), under "FOREIGN PATENT DOCUMENTS", in Column 1, Line 7, delete "JP H07231113 8/1995".

On Page 2, in Item (56), under "FOREIGN PATENT DOCUMENTS", in Column 1, Line 10, delete "JP H10215029 8/1998".

On Page 2, in Item (56), under "FOREIGN PATENT DOCUMENTS", in Column 1, Line 12, delete "JP H10303452 11/1998".

On Page 2, in Item (56), under "FOREIGN PATENT DOCUMENTS", in Column 1, Line 18, delete "JP 2006210620 8/2006".

On Page 2, in Item (56), under "FOREIGN PATENT DOCUMENTS", in Column 2, Line 2, delete "JP 07202340 8/2007".

On Page 2, in Item (56), under "FOREIGN PATENT DOCUMENTS", in Column 2, Line 3, delete "JP 2008056511 3/2008".

On Page 2, in Item (56), under "FOREIGN PATENT DOCUMENTS", in Column 2, Line 5, delete "JP 2008171835 7/2008".

On Page 2, in Item (56), under "FOREIGN PATENT DOCUMENTS", in Column 2, Line 14, delete "WO WO 2009106583 9/2009".

Signed and Sealed this
Twenty-fifth Day of November, 2014

Michelle K. Lee
*Deputy Director of the United States Patent and Trademark Office*

IN THE SPECIFICATION:

In Column 2, Line 53, delete "MgCdZnO" and insert -- MgCdZnO. --, therefor.

In Column 4, Line 16, delete "to 1" and insert -- to 1. --, therefor.

In Column 4, Line 55, delete "spinnel," and insert -- spinel, --, therefor.

IN THE CLAIMS:

In Column 10, Line 13, in Claim 13, delete "spinnel," and insert -- spinel, --, therefor.